United States Patent [19]

Kashio

[11] 4,079,234
[45] Mar. 14, 1978

[54] MANUAL KEY INPUT APPARATUS
[75] Inventor: Toshio Kashio, Tokyo, Japan
[73] Assignee: Casio Computer Co., Ltd., Tokyo, Japan
[21] Appl. No.: 749,225
[22] Filed: Dec. 10, 1976
[30] Foreign Application Priority Data
  Dec. 12, 1975 Japan .............................. 50-148076
[51] Int. Cl.$^2$ ............................................ G06M 3/02
[52] U.S. Cl. .......................... 235/92 DE; 235/92 CA; 235/92 R; 364/900
[58] Field of Search ........ 235/92 DE, 92 CA, 92 CT, 235/92 DP

[56] References Cited
U.S. PATENT DOCUMENTS

| 3,772,657 | 11/1973 | Marsalka et al. | 445/1 |
| 3,818,461 | 6/1974 | Ward et al. | 445/1 |

Primary Examiner—Joseph M. Thesz
Attorney, Agent, or Firm—Flynn & Frishauf

[57] ABSTRACT

A manual key input apparatus, which comprises a memory for successively storing the characters of each of a plurality of words includes in one record which is supplied from a key input device and marked off by a record-positioning code from the succeeding record data, and wherein a first counter counts a total number of characters of words included in one record supplied to the memory from the key input device; a counted number of characters of words is stored in a character number memory; comparison is made in a comparator between a number of characters of words constituting one record which has already been stored in the character number memory and a number of characters of words included in the succeeding record which has been counted by the first counter; where said comparison determines a number of characters of words constituting the succeeding record to be larger than a counted number of characters of words already stored in the character number memory, then the number of the characters of the words included the succeeding record is stored in said character number memory to replace the previously stored character number; counting is repeated, each time the character number memory is supplied with a number of characters of words included in one record from the key input device; a second counter detects the remaining storing capacity of the character number memory whose capacity varies with character numbers supplied in succession, from every last counted character number; comparison is made in a second comparator between a character number already stored in the character number memory and a character number counted by the second counter; where said comparison determines a number of characters counted by the second counter to be smaller than a number of characters already stored in the character number memory, then supply of a new record from the key input device to the character number memory is suspended.

2 Claims, 3 Drawing Figures

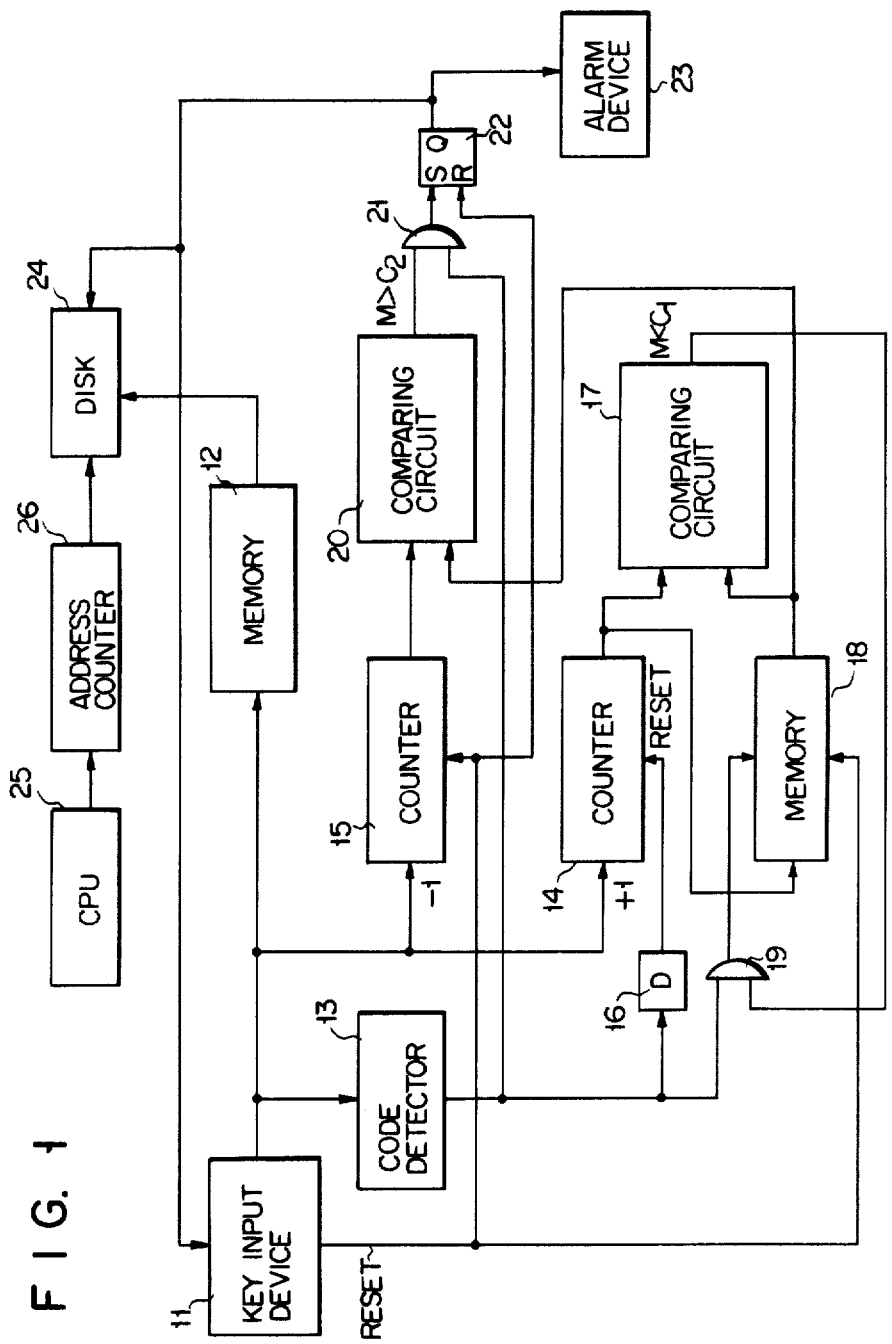
F I G. 1

Errrrxrrrrxrrrrrrrrrr̲Er-----
                 ↑
              1 RECORD r : DATA CHARACTER
X : WORD POSITIONING CODE
E : RECORD POSITIONING CODE

MANUAL KEY INPUT APPARATUS

BACKGROUND OF THE INVENTION

This invention relates to a manual key input apparatus for storing a memory with data being finally printed on, for example, a bill after required arithmetic processing.

There will now be described the conventional key input operation. Where datas being finally printed on various forms of bills are arithmetically processed by an electronic computer, said datas are first stored in a memory device such as a tape, drum or disk. Required datas are read out of the memory device to be arithmetically processed. The memory device is stored with datas generally by manually operated means. Namely, a keyboard operator carries out an input operation while reading datas from original slips. This input operation is conducted at a far lower speed than that at which data is generally processed. Further where correction of erroneous inputs resulting from the manual operation is taken into account, it is impossible to store datas supplied from a key input device intact in a memory device such as a tape, drum or disk. Therefore, datas supplied from the key input device are stored in a buffer memory. Thereafter, a unit amount of said datas is continuously read out from the buffer memory to, for example, a tape, drum or disk for preservation.

The buffer memory for storing datas supplied from the key input device has a limited storing capacity. Where a main memory device is formed of, for example, a magnetic disk, the buffer memory has its capacity set at a level only sufficient to store datas recorded in one track or sector of the magnetic disk. Where the buffer memory is stored with datas up to its prescribed capacity, the manual input operation is suspended. Datas stored in the buffer memory are shifted to a specified track or sector of the magnetic disk. Therefore, it is necessary during the key input operation to examine whether datas have been stored upto the maximum capacity of the buffer memory, and, when the maximum capacity is reached, suspend the key input operation.

Where manually supplied datas are to be printed on a bill after arithmetic operation, words specified for the respective columns of the bill are printed in series to provide one record. One record is stored in a buffer memory each time. Words constituting one record are collectively written in the same track or sector of the magnetic drum. Where it has been found that it is impossible to store the characters of the remaining words of one record beyond the maximum capacity of the buffer memory, then the key input operation is temporarily suspended. At this time, that word of the record which has been first stored in the buffer memory or some succeeding words of said record are read out to a main memory device to allow the buffer memory to have a sufficient capacity further to store the characters of the remaining words of the record. Thereafter, the characters of the word whose supply to the buffer memory has been suspended are again manually stored in said buffer memory, starting with the first character. Therefore, the customary key input operation is complicated due to one part thereof being doubled, presenting considerable difficulties where a record is formed of variable-length words, the number of whose characters is not fixed, but varies with the form in which a word is actually supplied.

SUMMARY OF THE INVENTION

This invention has been accomplished in view of the above-mentioned drawbacks of the prior art key input apparatus, and is intended to provide a manual key input apparatus which eliminates doubling of key input operation, enables datas to be smoothly written in an external memory device, for example, a disk and is particularly effective to store a record formed of variable-length words.

To attain the above-mentioned object, this invention provides a manual key input apparatus which comprises key input means for successively supplying the characters of words of one record each formed of a plurality of characters with the adjacent ones of the respective records marked off by an intervening record-positioning code; memory means for storing in series records supplied from the key input means; detection means for detecting a record-positioning code intervening the adjacent records; first counter means which is cleared upon receipt of a record-positioning code issued from the detection means and counting the characters of words constituting one record; character number-storing means for storing the number of characters counted by the counter means; first comparator means for comparing the number of characters of words of one record stored in the character number-counting means with the number of characters of words constituting the succeeding record, and, when determining the number of characters of words of the succeeding record to be larger than the counted number of characters of words stored in the character number-storing means, sending forth the number of characters of words of the succeeding record counted by the first counter means to the character number-storing means to replace the number of characters of words previously stored therein; second counter means for counting the number of characters of words constituting one record each time the respective characters are successively supplied from the key input means to the storing means and detecting the remaining capacity of the storing means whose capacity varies, each time the characters are supplied thereto, from every last counted number of characters; second comparator means for comparing the number of characters of words indicated by the second counter means with the number of characters of words read out of the character number-storing means; and means for suspending the supply of a new record from the key input means to the storing means when the second comparator means determines the number of characters of words counted by the second counter means to be smaller than the number of characters of words stored in the character number-storing means.

Where, therefore a keyboard operator temporarily stores a series of records in a buffer memory by manually operating a keyboard while reading datas shown on original slips, and in this case the number of characters of words constituting a record following a given record whose character numbers are stored in the buffer memory exceeds the capacity of said buffer memory, then the supply of the succeeding record from the key input device to the buffer memory is automatically suspended, thereby simplifying the conventional complicated input operation by eliminating the doubled portion of said operation. With the manual key input apparatus of this invention, judgement is made by detection of a record-positioning code intervening the adjacent records whether the number of characters of words constituting a given record exceeds the capacity of the buffery memory, thus presenting a prominent effect in the case where a record being printed on a bill is formed of variable-length words.

BRIEF DESCRIPTION OF THE DRAWING

FIG. 1 is a block circuit diagram of a manual key input apparatus embodying this invention;

DETAILED DESCRIPTION OF THE INVENTION

Figures 2, 3:
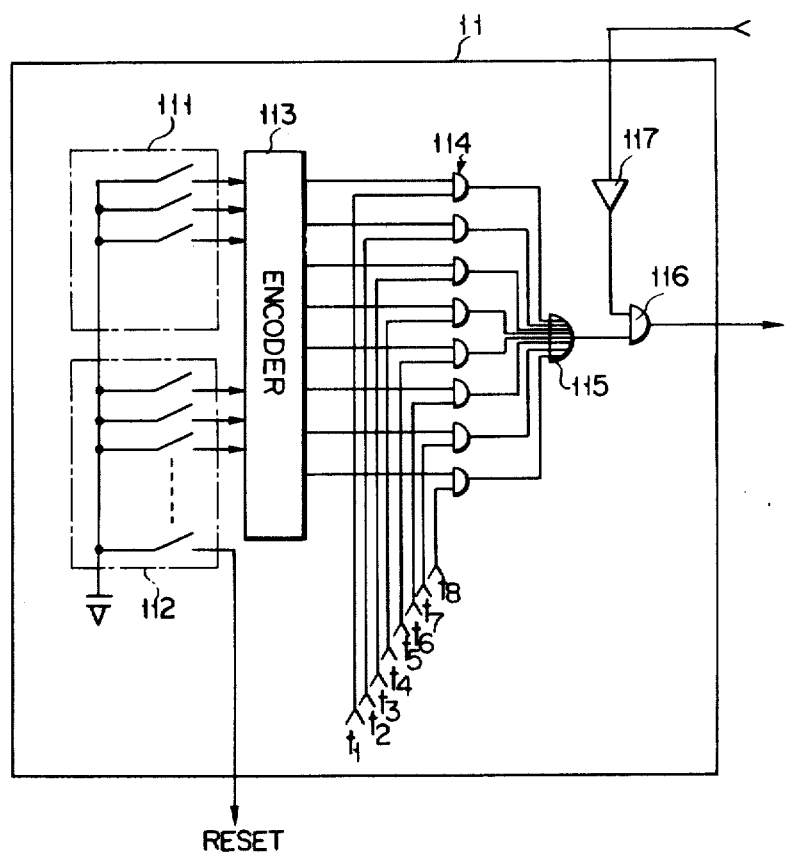
FIG. 2 shows the pattern in which a record is formed.
FIG. 3 indicates a concrete circuit arrangement of the key input device of FIG. 1.

There will now be described by reference to the appended drawings a manual key input device. An operator of the key input apparatus 11 of FIG. 1 transmits datas being printed on a bill to a buffer memory 12 in the coded form. One record being printed on a bill is formed of a series arranged words specified for the respective columns of said record. Records on the respective bill lines are stored in the buffer memory 12 in series. FIG. 2 schematically illustrates the pattern of a record. Adjacent words each formed of a plurality of characters denoted by γ are marked off by an intervening word-positioning code X. Adjacent records are marked off by an intervening record-positioning code E.

Data being printed on a bill which has been manually supplied by a keyboard operator is coded by the key input device of FIG. 3. The key input apparatus 11 comprises ten keys 111 and function keys 112. An input signal corresponding a depressed key is coded by an encoder 113 is written in the buffer memory 12 through those of a group 114 of AND circuits which correspond to the timings $t1$ and $t8$ in which the keys of the keyboard are operated, and also through an OR circuit 115 and AND circuit 116. One of the function keys is operated to supply a reset signal to the later described character number memory device and a counter for indicating the remaining capacity of the buffer memory 12.

Among the input datas supplied from the key input device 11, the record-positioning code E is detected by a code detector 13. Among the input datas supplied from the key input device 11, the characters of each word are successively supplied to a first counter 14 and second counter 15 to be counted thereby. The first counter 14 is reset by a signal denoting a code detected by the code detector 13 which has been delayed by a delay circuit 16. As the result, the contents of the first counter 14 are reduced to zero. Later, the first counter 14 carries out up-counting, each time characters following the record-positioning code E are successively supplied. Namely, the first counter 14 effects up-counting of [+1], each time one character is supplied. On the other hand, the record counter 15 is set at a maximum number of characters that can be stored in the buffer memory 12 up to its capacity and carries out down-counting of [−1], each time one character is supplied by input operation. The second counter 15 counts down its preset counts by [−1], each time one character is supplied from the key input device, thereby indicating the remaining capacity of the buffer memory 12.

An output signal from the first counter 14 is conducted to the comparator 17 to be compared with a number of characters read out from the character number memory device 18. The comparator 17 generates an output signal when determining an output count signal C1 from the first counter 14 to be larger than a count M read out from the character number memory 18 (M <C1). While the first counter 14 is counting a number of characters of words included in the first record supplied from the key input device 11, the contents of the character number memory device 18 indicate zero by operation of the reset key of the key input device 11. Upon detection of M <C1, the comparator 17 sends forth an output signal to one of the gates of the AND circuit 19. The other gate of this AND circuit 19 is supplied with a signal denoting a record-positioning code E immediately following the first record which was detected by the code detector 13. At this time, an output signal from the AND circuit 19 is supplied as a "write" instruction to the character number memory device 18, causing a number of characters of words of the first record which was counted by the first counter 14 to be stored in the character number memory device 18.

The contents of the first counter 14 are reset at zero by a signal which denotes the record positioning code E detected by the code detector 13 and is supplied through the delay circuit 16. Thus, the first counter 14 is reset, each time a number of characters of words of one record has been fully counted, and counts a number of characters of words of each succeeding record supplied in series by key input operation. Comparison is made between a number of characters of words of a given ground stored in the character number memory device 18 and a number of characters of words of the succeeding record counted by the first counter 14, each time the record is supplied from the key input device 11. As the result, the character number memory device 18 is stored with a maximum number of characters among a series of records supplied from the key input device 11.

As previously described, the second down-counter 15 is preset by operation of the reset key of the key input device 11 at a maximum number of characters of one record that can be stored in the buffer memory 12 up to its capacity. When the first counter 14 counts up a number of characters of words of one record by [+1] each time, the second counter 15 correspondingly counts down the number of characters by [−1] each time. Therefore, when the first counter 14 has fully counted up a number of characters of words of one record, the contents of the second down-counter 15 show the remaining capacity of the buffer memory 12. Comparison is made in a comparator 20 between an output signal from the down-counter 15 which shows the remaining capacity of the buffer memory 12 and an output signal from the character number memory device 18. The comparator 20 produces an output signal when said comparison determines the remaining capacity C2 of the buffer memory 12 indicated by the second down-counter 15 to be smaller than a maximum number M characters of words of one record stored in the character number memory device 18, namely M>C2. An output signal denoting M>C2 from the comparator 20 is supplied to one of the gates of an AND circuit 21. When a signal denoting the following record-positioning code E detected by the code detector 13 is supplied to the other gate of the AND circuit 21, then this circuit 21 sends forth an output signal to a flip-flop circuit 22 for setting. An output signal from the flip-flop circuit 22 is conducted to an alarm device 23, which in turn gives an alarm or makes a warning display, and also issues an input-stopping instruction to the key input device 11. Issue of this instruction proves that the buffer memory 12 has no more capacity to store an expected maximum number of characters of words of any succeeding record. As the result, a set output signal from the flip-flop circuit 22 is supplied as a "write" instruction to a disk 24, causing the preceding record stored in the buffer memory 12 to be shifted to the disk 24. In this case, an address counter 26 operated by an instruction from CPU25 specifies that address of the disk 24 in which said preceding record is to be written.

The buffer memory 12 of the foregoing embodiment well serves the purpose, only if it is so designed as to cause characters of words of one record to be successively read out from said buffer memory 12 in the order in which the characters were initially stored therein. Obviously, bits of each character may be arranged in series in parallel. If the buffer memory 12 is of the type in which datas are written by designating the addresses thereof in turn, then addition of an address designating-counter can indicate the remaining capacity of the buffer memory 12 for storing more characters, making it unnecessary to provide the first counter 14.

With the foregoing embodiment, one bill constitutes one record. For the object of this invention, however, one unit of datas formed of a plurality of words is also available for use. Further, it is possible to regard one original slip showing one item as one record and provide a plurality of records in a number corresponding to that of original slips handled by a key input device. Obviously, this invention is applicable in many other modifications without departing the object of the invention.

What is claimed is:
1. A manual key input apparatus comprising:
key input means for successively inputting character data of word data of each of a plurality of record data, a record-positioning code being interposed between adjacent records and each record including one or more word data, each word data including one or more character data;
memory means coupled to said key input means for storing in series the record data supplied from said key input means;
detection means coupled to said key input means for detecting the record positioning code which is interposed between adjacent record data;
counter means coupled to said detection means and which is adapted to be cleared each time said detection means detects the record positioning code, said counter means counting the character data of the word data in one record data;
character number-storing means coupled to said counter means for storing a data item corresponding to the number of characters counted by said counter means;
first comparator means coupled to said character number-storing means and to said counter means for comparing the number of character data in the word data of one record data which is represented by said data item stored in said character-number storing means with the number of character data in the word data of the subsequent record data which has been inputted from the key input means and counted by said counter means, and when the number of character data in the word data of said subsequent data is greater than the number of character data represented by said data item stored in said character number-storing means, sending the data corresponding to the number of characters in the word data of said subsequent data counted by said counter means to said character number-storing means to replace said data item previously stored therein;
control means for determining the remaining memory capacity of said memory means, said control means including means for determining a difference between the memory capacity of said memory means as preliminarily set and the number of character data in the record data supplied from the key input means;
second comparator means coupled to said control means and to said character number-storing means for comparing the remaining memory capacity of said memory means which is determined by said control means and the number of character data represented by said data item stored in said character number-storing means; and
means coupled to said second comparator means for inhibiting the record data from being inputted into said memory means from said key input means when said second comparator means detects that the remaining memory capacity determined by said control means is smaller than the number of character data represented by said data item stored in said character number-storing means.

2. The manual key input apparatus according to claim 1, wherein said inhibiting means includes an alarm display means for indicating a warning upon receipt of an output signal from said second comparator means.

* * * * *